United States Patent [19]

Di Biasi et al.

[11] 4,197,337

[45] Apr. 8, 1980

[54] OPTICAL TRANSFORMATION OF METALLIZED POLYMERIC FILM MATERIAL

[75] Inventors: Daniel J. Di Biasi, Pittsford; Robert V. Russo, Brooklyn, both of N.Y.

[73] Assignee: Mobil Oil Corporation, New York, N.Y.

[21] Appl. No.: 972,575

[22] Filed: Dec. 22, 1978

[51] Int. Cl.² .................. B44D 5/02; C23C 13/02
[52] U.S. Cl. .................. 427/270; 427/276; 427/360; 427/278; 427/404; 427/250; 428/461; 428/462; 427/383.1
[58] Field of Search .................. 427/383 R, 360, 276, 427/251, 257, 160, 170, 264, 250, 45, 270, 278; 204/20, 37 R; 428/461, 462

[56] References Cited

U.S. PATENT DOCUMENTS

| | | |
|---|---|---|
| 1,818,729 | 8/1931 | Marmorstein . |
| 1,832,199 | 11/1931 | George . |
| 2,285,058 | 6/1942 | Samson .................. 250/167 |
| 2,689,805 | 9/1954 | Croze et al. .................. 427/374 F |
| 2,862,835 | 12/1958 | Lederman .................. 427/257 |
| 2,865,787 | 12/1958 | Risch .................. 427/404 |
| 3,085,025 | 4/1963 | Eaton .................. 427/191 |
| 3,281,257 | 10/1966 | Rosen .................. 427/288 |
| 3,666,517 | 5/1972 | Isaacson .................. 427/245 |
| 3,741,788 | 6/1973 | Sheinharz .................. 427/191 |
| 3,914,471 | 10/1975 | Cobb et al. .................. 427/250 |
| 4,015,049 | 3/1977 | Yoda et al. .................. 427/250 |
| 4,029,831 | 6/1977 | Daunheimer .................. 427/264 |
| 4,048,349 | 9/1977 | White et al. .................. 427/58 |

FOREIGN PATENT DOCUMENTS 263434  9/1963  Australia .................. 427/257

*Primary Examiner*—Ralph S. Kendall
*Attorney, Agent, or Firm*—Charles A. Huggett; Ronald J. Cier

[57] ABSTRACT

Metallized polymeric film material having a high gloss, mirror-like surface is transformed by means of heat treatment to a material having a smooth lustrous surface appearance not unlike that of satin, or alternatively an apparent rough or granular surface texture (i.e. a matte-like finish). The transformation may be accomplished by directly heating the metallized film material or in conjunction with a laminating/thermoforming operation (for instance: the formation of disposable plastic dinnerware) to produce a rigid article having a pleasing appearance.

13 Claims, No Drawings

OPTICAL TRANSFORMATION OF METALLIZED POLYMERIC FILM MATERIAL

BACKGROUND OF THE INVENTION

1. Field of the Invention

This invention relates to metallized polymeric film material and more particularly to controlling the surface appearance of such metallized film material.

2. Description of the Prior Art

Metallized plastic film material has found many industrial and consumer oriented applications. For instance, it is widely employed as a useful and attractive packaging material. It is also desirable as a decorative wall covering material or in the manufacture of aesthetically pleasing components for the interior of automobile passenger compartments. Another popular application involves the formation of laminates of metallized film with rigid plastic material to manufacture disposable dinnerware items. In most applications the metallized film material will have a high gloss or mirror-like finish at its surface. If it is thought desirable to give the film material a softer, more satiny appearance, one frequent method used to accomplish such result has been the addition of an opaque topcoat to the film material, thereby dulling the mirror-like finish. Another method of dulling the finish has been to brush the surface and thereby, in effect, etch it to remove the gloss. Such a brushing approach, of course, has the basic requirement that the metallized film have a fairly thick layer of plastic material so that one does not completely wear through the film in the process of dulling it.

SUMMARY OF THE INVENTION

It has now been discovered that, by exposing metallized plastic films to temperatures between about 80° C. and about 210° C., one is able to controllably transform the high gloss or mirror-like appearance into a pleasing satin-like lustre.

The process of this invention may be carried out by passing a high gloss metallized sheet material through an oven or by bringing it into contact with a heated roller. Alternatively, another embodiment of this invention involves transformation of the high gloss surface appearance by means of heating carried out in conjunction with a conventional laminating and/or thermoforming operation to manufacture discrete articles of commerce. The high gloss metallized film material useful in the process of this invention may be any conventional plastic film material having a metalliferous, high gloss surface coating. Such conventional metallized film materials include, for instance: laminates of transparent plastic film and metal foil; vacuum metallized film materials; plastic film coated with metallic powder; etc.

DESCRIPTION OF SPECIFIC EMBODIMENTS

In a preferred embodiment of this invention a sheet of transparent plastic material, having a metallic coating on one or both surfaces thereof such that the coated sheet material takes on a high gloss mirror-like appearance, is heated to a temperature above the glass transition temperature and below the melting point of the plastic resin, preferably between about 80° C. and about 210° C. The film material may be heated for a period of time ranging from about 1 second to about 10 minutes, (preferably about 3 to about 20 seconds) until the high gloss surface is transformed into the desirable smooth, lustrous appearance of satin or, if desired, the rough or granular surface appearance of a matte finish.

The heat treatment may be accomplished by any conventional method for heating plastic film material. The coated sheet material may, for example, be passed through a forced-air oven with thermostatic temperature control or it may be brought into contact with a heated roller. Alternatively, heating may be accomplished by controlled exposure of the high gloss film to heat radiating lamps or even to a source of microwave radiation. Also, the film material may be heated on both of its major surfaces or the heat may be applied to only one surface thereof. If only a single surface of the metallized film material is to be brought in contact with the heat, and the metallized film is of the type having a metal layer on only a single surface of the plastic, it is preferred that the surface to be heated most directly comprise the uncoated plastic surface.

Polymeric materials of interest in this invention include those which are conducive to the formation of transparent films and which can be coated with a metallic material to produce a high gloss finish thereon. Non-limiting examples of polymeric materials include: polyacrylonitrile; polystyrene; polyesters (e.g. polyethylene terephthalate); polyethylene; polypropylene; polybutene; nylon; polyvinylchloride; polyamides [e.g. polycaprolactam, poly (hexamethylene adipamide)]: polycarbonates; and isomers and copolymers of these.

The film may be formed by casting or by extrusion, and it may be unstretched or stretched and oriented in one or more directions. In effect, any of the well known and conventional techniques for the formation of transparent film material may be employed for the formation of the base film for the metallized film material to which the instant processes are applied.

The metallic coating comprises any metallic coating material such as is normally used to coat plastic film material. Among such conventional coatings are aluminum, copper, copper alloys (bronze, etc.), zinc, gold, silver, stainless steel and the like. More than 80 metals and inorganic substances are known and used to form satisfactory coatings. The metallic coating may likewise be applied to the polymeric film by means of any conventional technique, for example: metallization of the polymer may be accomplished via lamination with metallic sheet material; vacuum deposition of the metal on the film; coating of the film with metal powders or solutions of metal in suitable solvent; and so forth.

Vacuum deposition of the metal on the surface of the plastic material, commonly known as "vacuum metallizing", may be accomplished by means of technology well known and practiced in the art. A description of a suitable vacuum metallizing technique is to be found in the book entitled *Extrusion and Other Plastic Operations*, edited by N. M. Bikales, published by Wiley Interscience, Inc. (pages 249 through 260), the entire contents of which are incorporated herein by reference. A description of a technique for surface coating of plastics with metallic powder may be found in U.S. Pat. No. 3,085,025 to M. S. Eaton, which description is likewise incorporated herein by reference. Other techniques for applying a metallic coating to the surface of a plastic material, such as solution coating with solvated metallic compounds, electroplating and lamination of metal films with plastic films, are likewise well known by those skilled in the applicable arts. Since the method of producing the high gloss metallized plastic film material to which the instant process is to be applied is not of particular concern in regard to the present invention, further details of the procedures for manufacturing such materials will not be necessary at this point as it is the subsequent treatment of the high gloss metallized film with which the present invention is primarily concerned.

As hereinabove disclosed, the desirable optical transformation of the present invention is accomplished by controllably increasing the temperature of the metallized film. Means suitable for increasing the temperature are numerous and well known in the art. One may, for instance, place the high gloss metallized film in an oven and slowly increase the temperature until the desired degree of optical transformation is achieved. Other suitable means for raising the temperature of the film include, for instance: passage of the high gloss film through an oven having a heated atmosphere (e.g. air, nitrogen, etc.) which is maintained at a predetermined constant temperature; passage of the high gloss film under heat radiating lamps (e.g. infra red lamps); bringing one or both surfaces of the high gloss metallized film into contact with a heated solid surface such as a heated roll; submerging the high gloss metallized film into a bath of heated liquid material; subjecting the high gloss metallized film to microwave radiation; and so forth. The apparatus and techniques employed in the utilization of any of these heating methods are well-known to those in the film forming industry. Suitable modification of existing apparatus to perform the desired heating is simply a matter of normal engineering expediencies. As mentioned above, if heating is to be accomplished by bringing only one surface of the high gloss metallized film into contact with the source of heat, or if the heat is to be directed at only one surface of the high gloss metallized film, and that film is of the type having a metal layer on only one surface thereof, it is preferred that the surface which is subjected to heating be that surface which does not carry the metal coating, i.e. the uncoated or transparent side of the metallized film material.

The high gloss metallized film useful in the present invention may be of substantially any thickness. It is to be understood, of course, that relatively thick coated plastic materials, when subjected to heating, are somewhat more difficult to heat controllably than are relatively thin films. Likewise, the relative thickness of the plastic substrate and the metallized coating thereon is not particularly limiting. The primary criteria for metal coated high gloss films useful herein is that: (1) the plastic film material be substantially optically transparent, particularly when only one surface of the film is metallized, and (2) the metal coating on the substrate be such as to produce a high gloss mirror-like finish when viewed through the adjacent film material. The uncoated plastic substrate should have a thickness of from about 0.1 to about 10 mils and preferably between about 0.5 and 5 mils. When the substrate is coated with a layer of metallizing material such layer would desirably have a thickness of from about 0.02 to about 0.5 microns and preferably between about 0.05 and 0.3 microns.

Another embodiment of this invention is the optical transformation of metallized film material wherein the high gloss metal layer is sandwiched between two layers of plastic film material. In such embodiment one or both layers of said sandwich may be transparent and the high gloss mirror-like surface may be visible on one or on both sides thereof. The two layers of plastic material may be of the same or different compositions. Both layers may be flexible or, alternatively, one layer may be rigid so as to form a rigid backing for the metallized material. Examples of such sandwich like materials in which the middle layer comprises a mirror-like metal material include, for instance: packaging materials such as paperboard or paper bonded to metallized film; dinnerware articles comprising rigid polymer (foamed or unfoamed) bonded to metallized film; wall coverings wherein the intermediate metal layer forms a decorative design; etc. Heating of such multi-layer materials is accomplished substantially as discussed above.

Still another embodiment of this invention comprises the hereindisclosed optical transformation while simultaneously forming a three layer laminate structure. Accomplishment of the desired optical transformation of the high gloss surface may be achieved coincidentally with the thermoforming of individual articles of rigid plastic material while simultaneously laminating to one surface thereof a transparent layer of plastic film with a layer of metallic material between said rigid plastic layer and said transparent layer. An example of this embodiment might include, for instance, the thermoforming of plastic dinnerware articles from polystyrene foam having a surface layer of transparent polystyrene film material and an intermediate layer of aluminum.

An additional embodiment would include, for instance, the thermoforming of paper/plastic dinnerware or packaging material from a plastic (e.g. polystyrene) film/paper laminate having a surface layer of transparent plastic film, an intermediate layer of metal (e.g. aluminum), and an inner or base layer of paperboard. Still another example might include the utilization of colored lacquer to overcoat the metal surface to simulate metallic colors - for instance, a yellow lacquer over aluminum to simulate gold - wherein the hereindisclosed optical transformation would result in a burnished appearance.

Another desirable embodiment of the hereindisclosed optical transformation technique comprises the heating and optical transformation of selected portions of a high gloss metallized material to impart a decorative effect thereto. For instance, one might wish to manufacture a wall covering material in which portions of the visible surface have a high gloss mirrored finish while other portions have a satiny lustre, the high gloss portions and the satiny portions being combined in various patterns to give a decorative effect. Another example of such embodiment involves the formation of specific patterns of mirror-like finish and satiny finish give the package increased eye appeal or impart information to the consumer. Numerous other applications in which only selected portions of the high gloss finish are optically transformed will be apparent upon consideration of this disclosure.

EXAMPLE 1

A sample of commercially obtainable, vacuum metallized, oriented polystyrene film was placed in a forced air oven at ambient temperature. The coated film material had a nominal thickness of 10 mils and the metal (aluminum) layer was approximately 0.4 microns thick. The oven temperature was increased at the rate of 10° C. per minute until the optical transformation of the high gloss surface was noticeable. Transformation occurred at 93° C. to 104° C. (200° F. to 220° F.).

EXAMPLE 2

A sample of commercially obtainable, vacuum metallized polyacrylonitrile film was placed in a forced air oven at ambient temperature. The coated film material had a nominal thickness of 0.7 mils, including the metal coating (aluminum) which was approximately 0.05 microns thick. The oven temperature was increased at the rate of 10° C. per minute until the optical transformation of the high gloss surface was noticeable. Transformation occurred at approximately 204° C. (400° F.).

EXAMPLE 3

A sample of commercially obtainable, vacuum metallized oriented polypropylene film was placed in a forced air oven at ambient temperature. The coated film material had a nominal thickness of 1 mil, including the metal coating (aluminum) which was approximately 0.05 microns thick. The oven temperature was increased at the rate of 10° C. per minute until the optical transformation of the high gloss surface was noticeable. Transformation occurred at approximately 104° C.–116° C. (220° F.–240° F.).

EXAMPLE 4

A sample of vacuum metallized polyethyleneterephthalate film was placed in a forced-air oven at ambient temperature. The coated film material had a nominal thickness of 0.5 mils, which included the metal layer (aluminum) of approximately 0.05 microns. The oven temperature was increased at the rate of 10° C. per minute until optical transformation was noticeable. Transformation occurred at approximately 149° C.–163° C. (300° F.–325° F.).

EXAMPLE 5

A biaxially oriented nylon film (0.5 mil) metallized on one surface with aluminum, was placed in an oven at 171° C. (340° F.) for 5 minutes. The high gloss finish was transformed into a pleasing, soft and satiny lustre.

EXAMPLE 6

A laminate comprising aluminized polyester film (1 mil) bonded to paper was heated in an oven at 171° C. (340° F.) for 5 minutes. Again, the treated material took on a pleasing satiny appearance not exhibited by the untreated laminate.

Although the process of this invention has been illustrated with reference to preferred embodiments, it is to be understood that modifications and variations may be employed without departing from the spirit of the concept disclosed herein, as those skilled in the art will readily understand. Such variations and modifications are therefore considered to be within the purview and scope of the appended claims.

We claim:

1. A process for controlled optical transformation of the high gloss, mirror-like surface appearance of a metallized plastic material to a relatively dull, satiny lustre or to a grainy matte finish, said process comprising heating the high gloss metallized plastic to a temperature above the glass transition temperature of the plastic resin, for a period of time sufficient to effect the desired degree of transformation.

2. The process of claim 1 in which said metallized plastic is metallized by coating it with aluminum.

3. The process of claim 1 in which said metallized plastic is metallized by coating it with copper or copper alloy.

4. The process of claim 1 in which said metallized plastic is metallized by coating it with zinc.

5. The process of claim 1 wherein said plastic comprises polystyrene.

6. The process of claim 1 wherein said plastic comprises polyacrylonitrile.

7. The process of claim 1 wherein said plastic comprises polypropylene.

8. The process of claim 1 wherein said plastic comprises polyethyleneterephthalate.

9. The process of claim 1 wherein said high gloss metallized plastic is heated to a temperature of between about 80° C. and 210° C. for from about 1 second to about 10 minutes.

10. The process of claim 1 wherein preselected portions of said high gloss metallized plastic material are heated to achieve said optical transformation and other portions remain substantially unheated, thereby achieving a decorative or other design effect through the presence of both high gloss portions and satiny portions in the metallized plastic so treated.

11. The process of claim 1 wherein said metallized plastic material is a three layer laminate comprising a first layer of plastic material, a second layer of the same or different plastic material, and a layer of high gloss metallizing material intermediate of said first and second layers of plastic material; at least one of said layers of plastic material being transparent and said high gloss metallizing layer being visible through said transparent plastic layer.

12. The process of claim 11 wherein said first layer of plastic material is transparent and said second layer comprises a relatively rigid, thermoformable plastic material.

13. The process of claim 1 wherein said metallized plastic material is a three layer laminate comprising a first layer of plastic material, a second layer of paper and a layer of high gloss metallizing material intermediate of said first and second layers; said layer of plastic material being transparent and said high gloss metallizing layer being visible through said transparent plastic layer.

* * * * *